(12) United States Patent
Wu et al.

(10) Patent No.: US 7,042,019 B1
(45) Date of Patent: May 9, 2006

(54) GALLIUM-NITRIDE BASED MULTI-QUANTUM WELL LIGHT-EMITTING DIODE N-TYPE CONTACT LAYER STRUCTURE

(75) Inventors: Liang-Wen Wu, Banciao (TW); Ru-Chin Tu, Tainan (TW); Cheng-Tsang Yu, Wufong Township, Taichung County (TW); Tzu-Chi Wen, Tainan (TW); Fen-Ren Chien, Yonghe (TW)

(73) Assignee: Formosa Epitaxy Incorporation, Taoyuan (TW)

( * ) Notice: Subject to any disclaimer, the term of this patent is extended or adjusted under 35 U.S.C. 154(b) by 0 days.

(21) Appl. No.: 10/964,351

(22) Filed: Oct. 12, 2004

(51) Int. Cl.
*H01L 29/205* (2006.01)
*H01L 27/15* (2006.01)

(52) U.S. Cl. .......................... 257/97; 257/96; 257/15; 257/18

(58) Field of Classification Search .............. 257/94, 257/96, 97, 101, E33.033, E33.034, E33.032, 257/E33.03, E33.028, E33.025, E33.01, 15, 257/18, 79
See application file for complete search history.

(56) References Cited

U.S. PATENT DOCUMENTS 6,172,382 B1 * 1/2001 Nagahama et al. ............ 257/94
2003/0127658 A1 * 7/2003 Sheu et al. .................... 257/79

* cited by examiner

*Primary Examiner*—Kenneth Parker
*Assistant Examiner*—Matthew C Landau

(57) ABSTRACT

A structure for the n-type contact layer in the GaN-based MQW LEDs is provided. Instead of using Si-doped GaN as commonly found in conventional GaN-based MQW LEDs, the n-type contact layer provided by the present invention achieves high doping density ($>1 \times 10^{19}$ cm$^{-3}$) and low resistivity through a superlattice structure combining two types of materials, $Al_m In_n Ga_{1-m-n}N$ and $Al_p In_q Ga_{1-p-q}N$ ($0 \leq m, n < 1$, $0 < p,q < 1$, $p+q \leq 1$, $m<p$), each having its specific composition and doping density. In addition, by controlling the composition of Al, In, and Ga in the two materials, the n-type contact layer would have a compatible lattice constant with the substrate and the epitaxial structure of the GaN-based MQW LEDs. This n-type contact layer, therefore, would not chap from the heavy Si doping, have a superior quality, and reduce the difficulties of forming n-type ohmic contact electrode. In turn, the GaN-based MQW LEDs would require a lower operation voltage.

10 Claims, 5 Drawing Sheets

GALLIUM-NITRIDE BASED MULTI-QUANTUM WELL LIGHT-EMITTING DIODE N-TYPE CONTACT LAYER STRUCTURE

BACKGROUND OF THE INVENTION

1. Field of the Invention

The present invention generally relates to the gallium-nitride based multi-quantum well light-emitting diodes and, more particularly, to the n-type contact layer structure of the gallium-nitride based multi-quantum well light-emitting diodes.

2. The Prior Arts

Gallium-nitride (GaN) materials can achieve a wide range of band gaps by controlling the GaN-based materials' compositions. As such, various colored light-emitting diodes (LEDs), especially those blue or purple light LEDs that require wide band gaps, can be produced using GaN-based materials. These GaN-based LEDs therefore have been the research and development focus in recent years.

Within conventional GaN-based LEDs, the active layers usually adopt a multi-quantum well (MQW) structure with GaN and indium-gallium-nitride ($In_xGa_{1-x}N$, $0 \leq x \leq 1$) as potential wells. Photons are then generated through the recombination of the electrons and holes within the potential wells. Inside these conventional GaN-based MQW LEDs, the active layers are usually formed on top of an n-type contact layer made of n-type doped GaN.

Usually, in order to achieve low resistivity, the n-type GaN contact layer is heavily silicon (Si) doped ($>1\times10^{19}$ cm$^{-3}$). However, it is observed that, during practical fabricating processes, the n-type GaN contact layer would be easily chapped and snapped, as the heavy Si doping causes incompatible lattice constants among the epitaxial layers of the GaN-based MQW LEDs, that, in turn, causes excessive stress to develop and accumulate. These undesirable results not only affect the epitaxial quality of the GaN-based MQW LEDs, but also add additional difficulties in the formation of the n-type ohmic contact electrode on top of the n-type GaN contact layer. In summary, these shortcomings would result in an inferior electrical characteristics or conductivity in the GaN-based MQW LEDs. In the worst case, the GaN-based MQW LEDs would be un-useable. Therefore, the GaN-based MQW LEDs containing this type of conventional n-type GaN contact layers, on one hand, require a higher operation voltage and, thereby, consume more powers. On the other hand, the GaN-based MQW LEDs would have a low yield rate, causing the production cost to rise.

Additionally, pin holes are easier to form in the heavily Si-doped n-type GaN contact layer, causing the semiconducting characteristics of the GaN-based MQW LEDs to deteriorate. Current leakage is also possible during the operation of the GaN-based MQW LEDs.

Accordingly, the present invention is directed to overcome the foregoing disadvantages of conventional GaN-based MQW LEDs according to prior arts.

SUMMARY OF THE INVENTION

The present invention provides an epitaxial structure for the GaN-based MQW LEDs' n-type GaN contact layers, so that the limitations and disadvantages from the prior arts can be obviated practically.

The theory behind the present invention would be apparent from a study of the attached FIG. 1. FIG. 1 is a graph showing group III nitrides in a coordinate system of lattice constant and band gap. As shown in FIG. 1, GaN has a lattice constant $a_0$ around 3.18 Å. Extended from GaN's position in FIG. 1 vertically along a lattice matching line, it can be seen that aluminum-indium-gallium-nitride ($Al_xIn_yGa_{1-x-y}N$, $0 \leq x,y<1$, $x+y \leq 1$) has an identical lattice constant to but has a wider band gap than that of GaN. Then, instead of using Si-doped GaN, an n-type contact layer having high doping density ($>1\times10^{19}$ cm$^{-3}$) and low resistivity can be achieved through a superlattice structure combining two types of material, $Al_mIn_nGa_{1-m-n}N$ and $Al_pIn_qGa_{1-p-q}N$ ($0 \leq m,n<1$, $0<p,q<1$, $p+q \leq 1$, $m<p$), each having its specific composition and doping density. In addition, by controlling the composition of Al, In, and Ga in the two materials, the n-type contact layer would have a compatible lattice constant with the substrate and the epitaxial structure of the GaN-based MQW LEDs. This n-type contact layer would not chap from the heavy Si doping, have a superior quality, and reduce the difficulties of forming n-type ohmic contact electrode. In turn, the GaN-based MQW LEDs would require a lower operation voltage.

The foregoing and other objects, features, aspects and advantages of the present invention will become better understood from a careful reading of a detailed description provided herein below with appropriate reference to the accompanying drawings.

DETAILED DESCRIPTION OF THE PREFERRED EMBODIMENTS

In the following, detailed description along with the accompanied drawings is given to better explain preferred embodiments of the present invention. Please be noted that, in the accompanied drawings, which are merely illustrative, some parts are not drawn to scale or are somewhat exaggerated, so that people skilled in the art can better understand the principles of the present invention.

Figure 1:
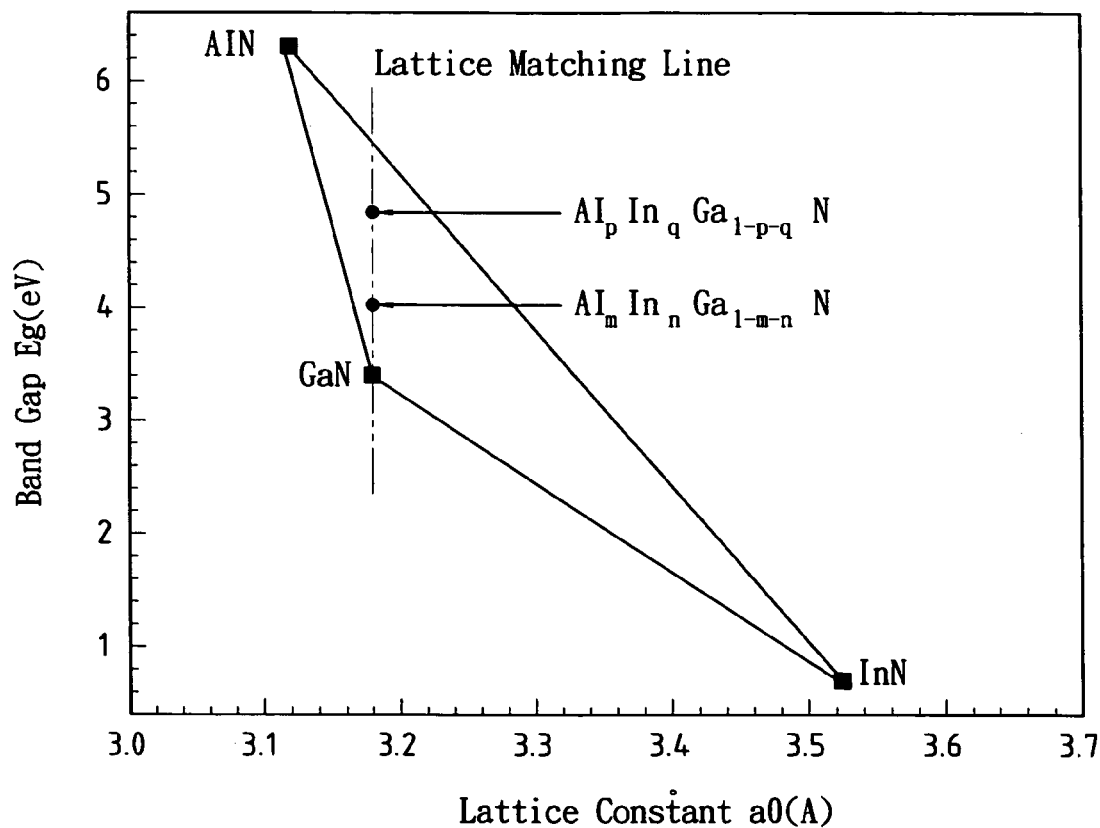
FIG. 1 is a graph showing group III nitrides in a coordinate system of lattice constant and band gap.
Figure 2:
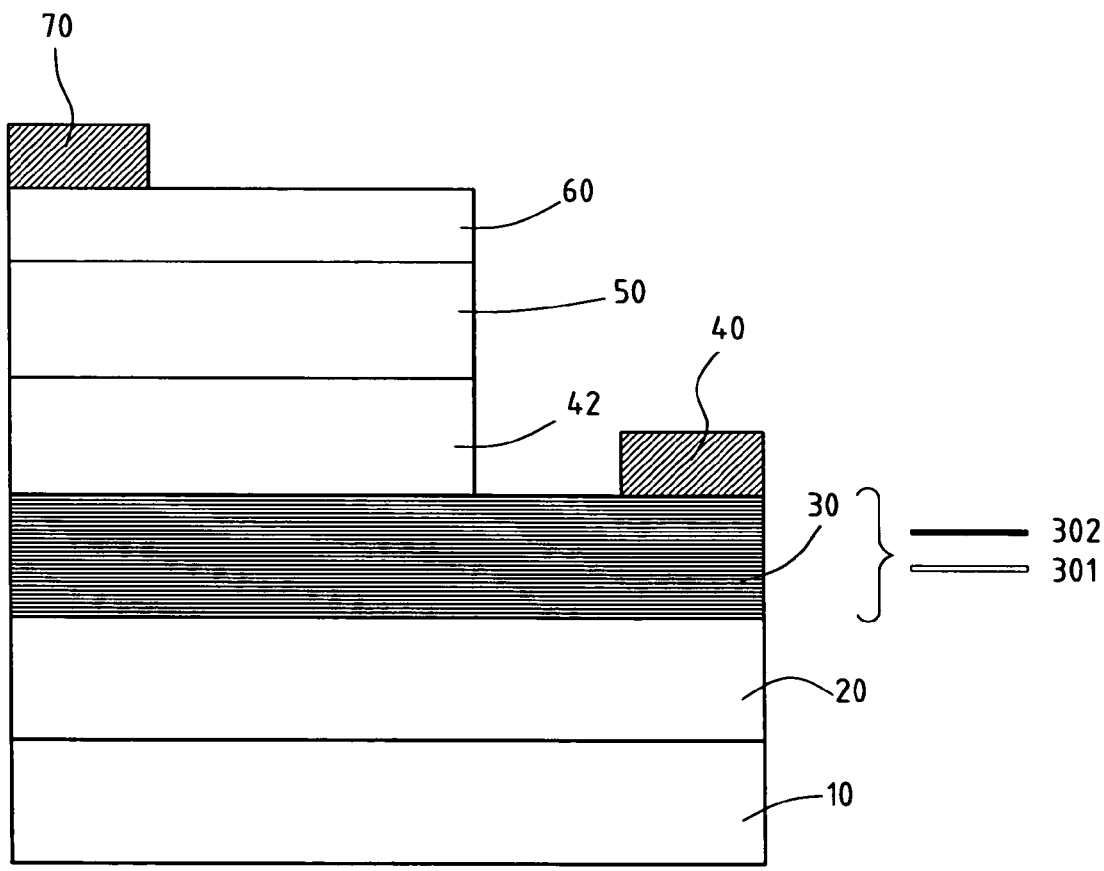
FIG. 2 is a schematic diagram showing the epitaxial structure of the GaN-based MQW LED according to the first embodiment of the present invention.

FIG. 2 is a schematic diagram showing the epitaxial structure of the GaN-based MQW LED according to the first embodiment of the present invention. As shown in FIG. 2, the GaN-based LED has a substrate 10 made of C-plane, R-plane, or A-plane aluminum-oxide monocrystalline (sapphire), or an oxide monocrystalline having a lattice constant compatible with that of nitride semiconductors. The substrate 10 can also be made of SiC (6H-SiC or 4H-SiC), Si, ZnO, GaAs, or $MgAl_2O_4$. Generally, the most common material used for the substrate 10 is sapphire or SiC. A buffer layer 20 made of $Al_aGa_bIn_{1-a-b}N$ ($0 \leq a,b<1$, $a+b \leq 1$) having a specific composition is then formed on an upper side of the substrate 10. On top of the buffer layer 20, an n-type contact layer 30 is formed, which is the major focus of the present invention. Then, on top of n-type contact layer 30, an active layer 42 made of InGaN covers a part of the n-type contact layer 30's upper surface. A negative electrode 40, on the other hand, is on top of another part of the n-type contact layer 30's upper surface not covered by the active layer 42.

On top of the active layer 42, a p-type cladding layer 50, a p-type contact layer 60, and a positive electrode 70 covering a part of the p-type contact layer 60's upper surface are sequentially stacked in this order from bottom to top. The p-type cladding layer 50 on top of the active layer 42 is made of magnesium (Mg)-doped $Al_{1-c-d}Ga_cIn_dN$ ($0 \leq c,d<1$, $c+d \leq 1$) having a specific composition. On the other hand, the p-type contact layer 60 on top of the p-type cladding layer 50 is made of Mg-doped $Al_{1-e-f}Ga_eIn_fN$ ($0 \leq e,f<1$, $e+f \leq 1$) having another specific composition.

Within this embodiment of the present invention, as shown in FIG. 2, the n-type contact layer 30 has a superlattice structure formed by multiple Si-doped GaN base layers 301 and multiple Si-doped AlGaN base layers 302, alternately stacked on top of each other. Among them, the AlGaN base layers 302 have wider band gaps than those of the GaN base layers 301. The n-type contact layer 30 can have either a GaN base layer 301 or an AlGaN base layer 302 as the bottommost base layer. That is, the n-type contact layer 30 can comprise a GaN base layer 301, an AlGaN base layer 302, another GaN base layer 301, etc., sequentially stacked in this repetitive pattern from bottom to top. Or, the n-type contact layer 30 can comprise an AlGaN base layer 302, a GaN base layer 301, another AlGaN base layer 302, etc., sequentially stacked in this repetitive pattern from bottom to top. Each of the GaN base layers 301 has a growing temperature between 600° C. and 1200° C., and a thickness between 20 Å and 200 Å, which is independent of the other base layers. Similarly, each of the AlGaN base layer 302 is made of $Al_{1-g}Ga_gN$ ($0<g<1$) having an independent and specific composition, a growing temperature also between 600° C. and 1200° C., and a thickness between 20 Å and 200 Å, which is independent of the other base layers. The total thickness of the n-type contact Layer 30 is between 2 μm and 5 μm, containing total 50–500 layers of the GaN base layer 301 and the AlGaN base layer 302. At least one of the base layers within the n-type contact layer 30, whether it is the GaN base layer 301 or the AlGaN base layer 302, has a Si doping density greater than $1 \times 10^{19}$ cm$^{-3}$. The number of GaN base layers 301 differs from the number of AlGaN base layers 302 by at most one.

Figure 3:
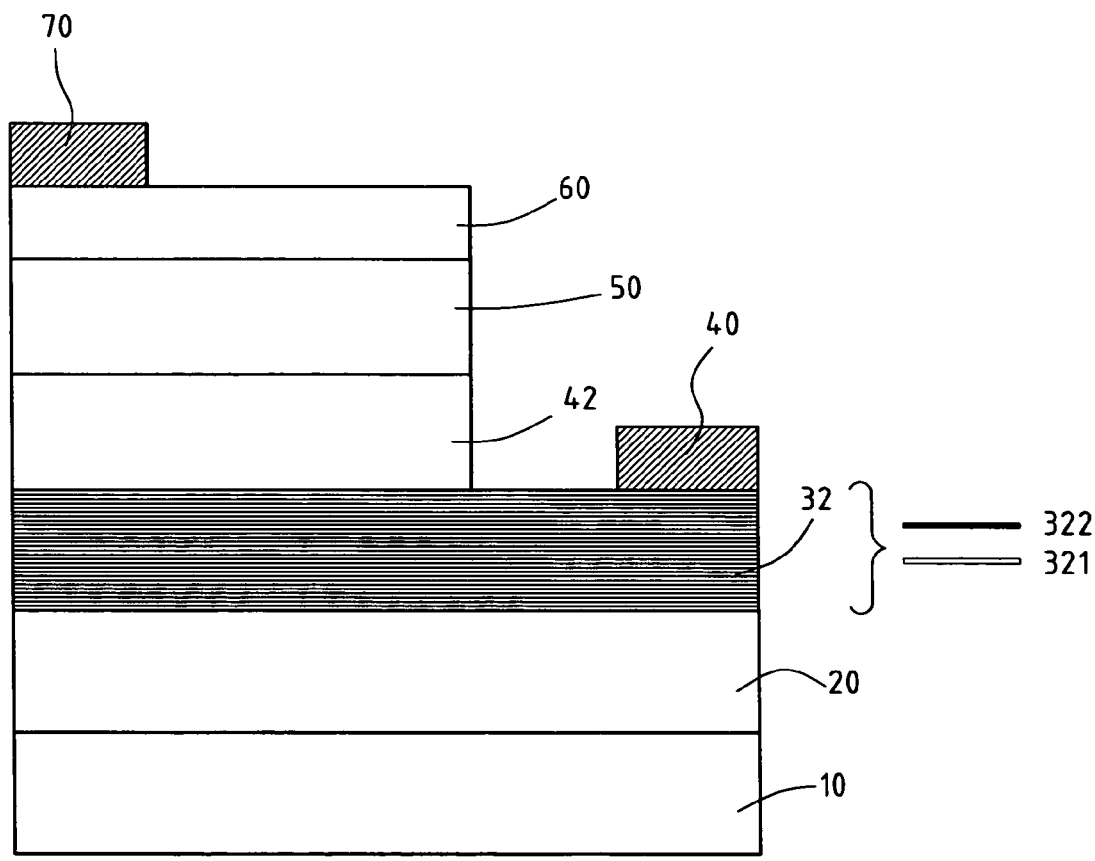
FIG. 3 is a schematic diagram showing the epitaxial structure of the GaN-based MQW LED according to the second embodiment of the present invention.

FIG. 3 is a schematic diagram showing the epitaxial structure of the GaN-based MQW LED according to the second embodiment of the present invention. As shown in FIG. 3, the n-type contact layer 32 has a structure identical to that of the n-type contact layer 30 of the first embodiment. The only difference lies in the materials used for the n-type contact layer 32. Within this embodiment of the present invention, as shown in FIG. 3, the n-type contact layer 32 has a superlattice structure formed by multiple In- and Si-codoped GaN base layers 321 and multiple In- and Si-codoped AlGaN base layers 322, alternately stacked on top of each other. Among them, the AlGaN base layers 322 have wider band gaps than those of the GaN base layers 321. The n-type contact layer 32 can have either a GaN base layer 321 or an AlGaN base layer 322 as the bottommost base layer. That is, the n-type contact layer 32 can comprise a GaN base layer 321, an AlGaN base layer 322, another GaN base layer 321, etc., sequentially stacked in this repetitive pattern from bottom to top. Or, the n-type contact layer 32 can comprise an AlGaN base layer 322, a GaN base layer 321, another AlGaN base layer 322, etc., sequentially stacked in this repetitive pattern from bottom to top. Each of the GaN base layers 321 has a growing temperature between 600° C. and 1200° C., and a thickness between 20 Å and 200 Å, which is independent of the other base layers. Similarly, each of the AlGaN base layer 322 is made of $Al_{1-h}Ga_hN$ ($0<h<1$) having an independent and specific composition, a growing temperature also between 600° C. and 1200° C., and a thickness between 20 Å and 200 Å, which is independent of the other base layers. The total thickness of the n-type contact layer 32 is between 2 μm and 5 μm, containing total 50–500 layers of the GaN base layer 321 and the AlGaN base layer 322. At least one of the base layers within the n-type contact layer 32, whether it is the GaN base layer 321 or the AlGaN base layer 322, has an In and Si doping density greater than $1 \times 10^{19}$ cm$^{-3}$. The number of GaN base layers 321 differs from the number of AlGaN base layers 322 by at most one.

Figure 4:
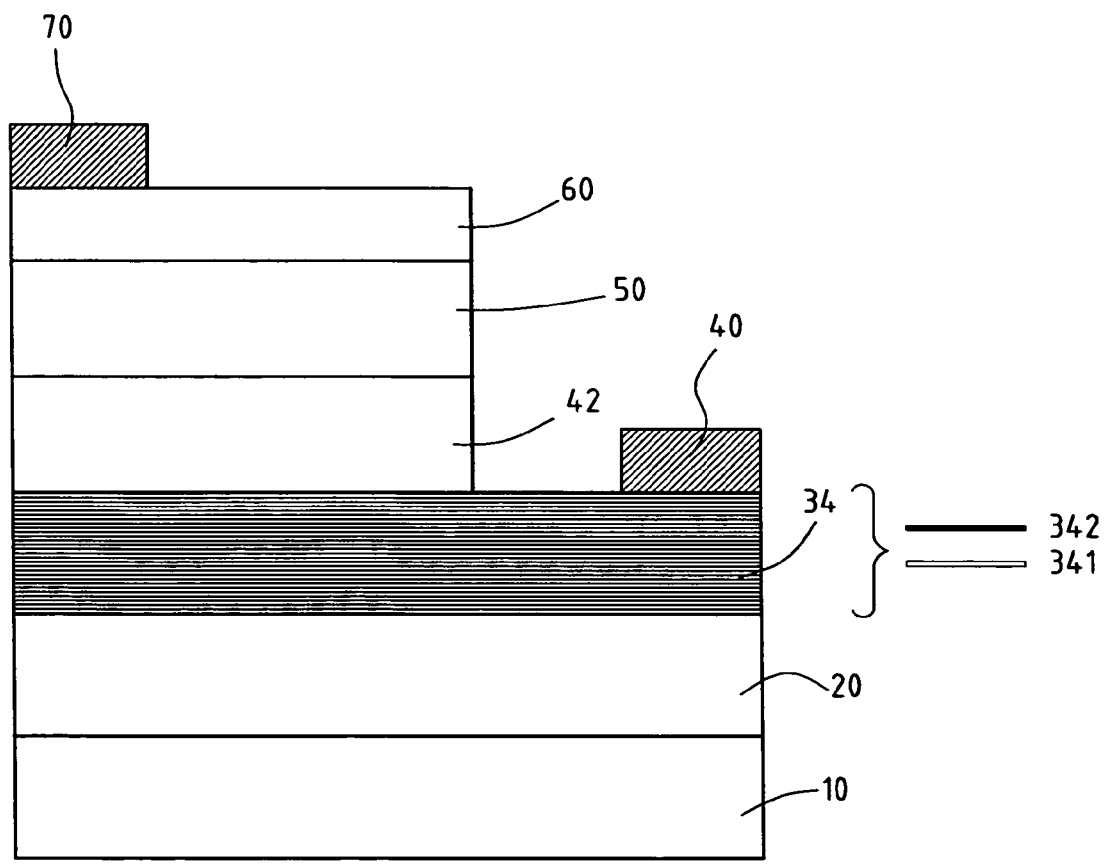
FIG. 4 is a schematic diagram showing the epitaxial structure of the GaN-based MQW LED according to the third embodiment of the present invention.

FIG. 4 is a schematic diagram showing the epitaxial structure of the GaN-based MQW LED according to the third embodiment of the present invention. As shown in FIG. 4, the n-type contact layer 34 has a structure identical to those of the n-type contact layer 30 of the first embodiment, and the n-type contact layer 32 of the second embodiment. The only difference lies in the materials used for the n-type contact layer 34. Within this embodiment of the present invention, as shown in FIG. 4, the n-type contact layer 34 has a superlattice structure formed by multiple In- and Si-codoped AlGaN base layers 341 and multiple In- and Si-codoped AlGaN base layers 342, alternately stacked on top of each other. Among them, the AlGaN base layers 342 have wider band gaps than those of the AlGaN base layers 341. The n-type contact layer 34 can have either an AlGaN base layer 341 or an AlGaN base layer 342 as the bottommost base layer. That is, the n-type contact layer 34 can comprise an AlGaN base layer 341, an AlGaN base layer 342, another AlGaN base layer 341, etc., sequentially stacked in this repetitive pattern from bottom to top. Or, the n-type contact layer 34 can comprise an AlGaN base layer 342, an AlGaN base layer 341, another AlGaN base layer 342, etc., sequentially stacked in this repetitive pattern from bottom to top. Each of the AlGaN base layers 341 and 342 is made of $Al_{1-k}Ga_kN$, ($0<k<1$) having an independent and specific composition, has a growing temperature between 600° C. and 1200° C., and a thickness between 20 Å and 200 Å, which is independent of the other base layers. The adjacent AlGaN base layers 341 and 342 have different material compositions, hut the non-adjacent AlGaN base layers 341 and 342 can have either identical or different material compositions. The total thickness of the n-type contact layer 34 is between 2 μm and 5 μm, containing total 50–500 layers of the AlGaN base layer 341 and the AlGaN base layer 342. At least one of the base layers within the n-type contact layer 34, whether it is the AlGaN base layer 341 or the AlGaN base layer 342, has an In and Si doping density greater than $1 \times 10^{19}$ cm$^{-3}$. The number of AlGaN base layers 341 differs from the number of AlGaN base layers 342 by at most one.

Figure 5:
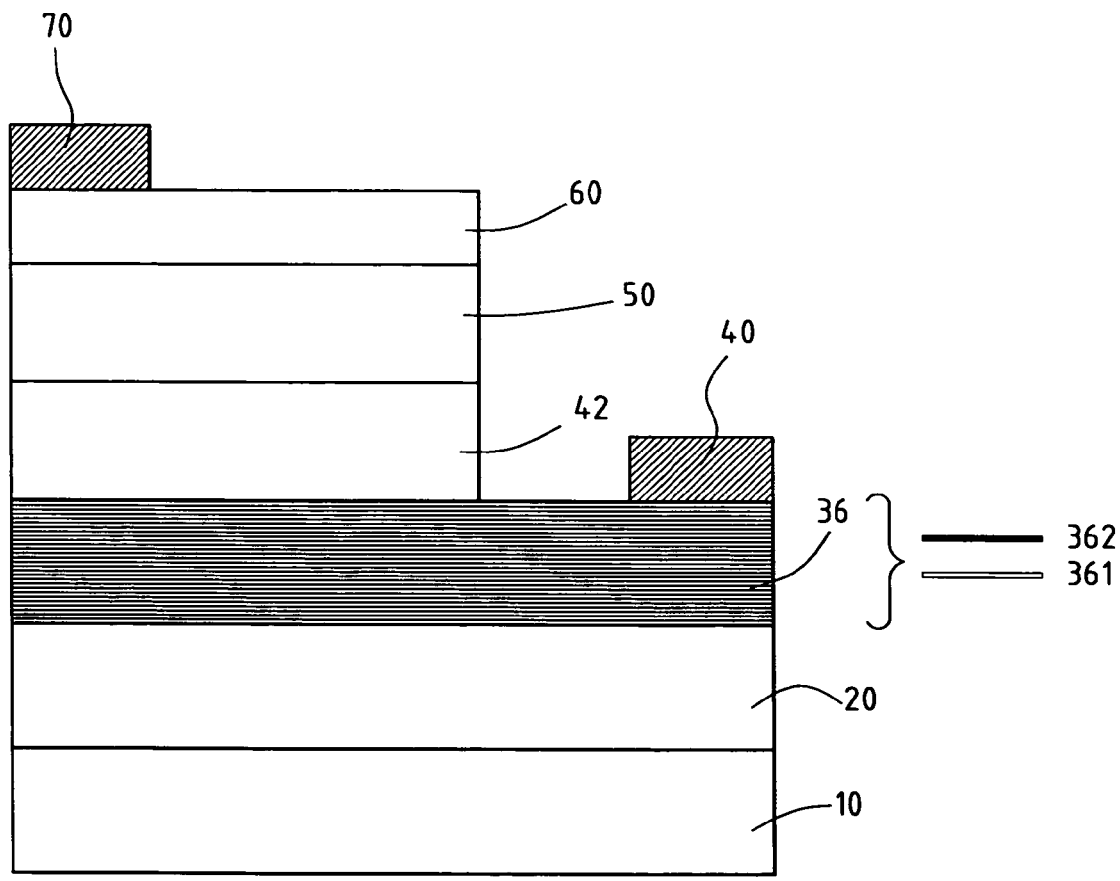
FIG. 5 is a schematic diagram showing the epitaxial structure of the GaN-based MQW LED according to the fourth embodiment of the present invention.

FIG. 5 is a schematic diagram showing the epitaxial structure of the GaN-based MQW LED according to the fourth embodiment of the present invention. As shown in FIG. 5, the n-type contact layer 36 has a structure identical to those of the n-type contact layers of the previous embodiments. The only difference lies in the materials used for the n-type contact layer 36. Within this embodiment of the present invention, as shown in FIG. 5, the n-type contact layer 36 has a superlattice structure formed by multiple Si-doped AlInGaN base layers 361 and multiple Si-doped AlInGaN base layers 362, alternately stacked on top of each other. Among them, the AlInGaN base layers 362 have wider band gaps than those of the AlInGaN base layers 361. The n-type contact layer 36 can have either an AlInGaN base layer 361 or an AlInGaN base layer 362 as the bottommost base layer. That is, the n-type contact layer 36 can comprise an AlInGaN base layer 361, an AlInGaN base layer 362, another AlInGaN base layer 361, etc., sequentially stacked in this repetitive pattern from bottom to top. Or, the n-type contact layer 36 can comprise an AlInGaN base layer 362, an AlInGaN base layer 361, another AlInGaN base layer 362, etc., sequentially stacked in this repetitive pattern from bottom to top. Each of the AlInGaN base layers 361 and 362 is made of $Al_iIn_jGa_{1-i-j}N$ (0<i,j<1, i+j≦1) having an independent and specific composition, has a growing temperature between 600° C. and 1200° C., and a thickness between 20 Å and 200 Å, which is independent of the other base layers. The adjacent AlInGaN base layers 361 and 362 have different material compositions, but the non-adjacent AlInGaN base layers 361 and 362 can have either identical or different material compositions. The total thickness of the n-type contact layer 36 is between 2 μm and 5 μm, containing total 50–500 layers of the AlInGaN base layer 361 and the AlInGaN base layer 362. At least one of the base layers within the n-type contact layer 36, whether it is the AlInGaN base layer 361 or the AlInGaN base layer 362, has a Si doping density greater than $1 \times 10^{19}$ cm$^{-3}$. The number of AlInGaN base layers 361 differs from the number of AlInGaN base layers 362 by at most one.

Within the foregoing preferred embodiments of the present invention, an n-type contact layer having high doping density (>$1 \times 10^9$ cm$^{-3}$) and low resistivity is achieved through a superlattice structure combining two types of material, $Al_mIn_nGa_{1-m-n}N$ and $Al_pIn_qGa_{1-p-q}N$ (0≦m,n<1, 0<p,q≦1, p+q≦1, m<p), each having its specific composition and doping density. In addition, by controlling the composition of Al, In, and Ga in the two materials, the n-type contact layer would have a compatible lattice constant with the substrate and the epitaxial structure of the GaN-based MQW LEDs. This n-type contact layer would not chap from the heavy Si doping, have a superior quality, and reduce the difficulties of forming n-type ohmic contact electrode. In turn, the GaN-based MQW LEDs would require a lower operation voltage.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A GaN-based MQW LED structure, comprising:
   a substrate made of a material selected from the group consisting of sapphire, 6H-SiC, 4H-SiC, Si, ZnO, GaAs, $MgAl_2O_4$, and an oxide monocrystalline having a lattice constant compatible with that of nitride semiconductors;
   a buffer layer made of $Al_aGa_bIn_{1-a-b}N$ (0≦a,b<1, a+b≦1) having a specific composition located on top of an upper side of said substrate;
   an n-type contact layer located on top of said buffer layer;
   an active layer made of InGaN located on top of a part of said n-type contact layer's upper surface;
   a negative electrode located on top of another part of said n-type contact layer's upper surface not covered by said active layer;
   a p-type cladding layer made of Mg-doped $Al_{1-c-d}Ga_cIn_dN$ (0≦c,d≦1, c+d≦1) having a specific composition located on top of said active layer;
   a p-type contact layer made of Mg-doped $Al_{1-e-f}Ga_eIn_fN$ (0≦e,f<1, e+f≦1) having a specific composition located on top of said p-type cladding layer; and
   a positive electrode located on top of a part of said p-type contact layer's upper surface,
   wherein said n-type contact layer has a superlattice structure formed by a first number of first base layers made of an n-type group III nitride, and a second number of second base layers made of another n-type group III nitride, alternately stacked on top of each other, said second base layers have wider band gaps than those of said first base layers, a bottommost base layer of said n-type contact layer is selected from the group consisting of said first base layer and said second base layer, and a topmost base layer is selected from the group consisting of said first base layer and said second base layer; and wherein each or said first base layers is made of In- and Si-codoped GaN having a doping density independent of other base layers, and each of said second base layers is made of In- and Si-codoped $Al_{1-h}Ga_hN$ (0<h<1) having specific composition and doping density independent of other base layers.

2. The GUN-based MQW LED structure as claimed in claim 1, wherein said n-type contact layer has a thickness between 2 μm and 5 μm.

3. The GaN-based MQW LED structure as claimed in claim 1, wherein a sum of said first number and said second number is between 50 and 500, and a difference between said first number and said second number is at most one.

4. The GaN-based MQW LED structure as claimed in claim 1, wherein each of said first base layers and said second base layers has a thickness between 20 Å and 200 Å, independent of other base layers.

5. The GaN-based MQW LED structure as claimed in claim 1, wherein at least one of said first base layers and said second base layers has an In and Si doping density greater than $1 \times 10^{19}$ cm$^{-3}$.

6. A GaN-based MQW LED structure comprising:
   a substrate made of a material selected from the group consisting of sapphire, 6H-SiC, 4H-SiC, Si, ZnO, GaAs, $MgAl_2O_4$, and an oxide monocrystalline having, a lattice constant compatible with that of nitride semiconductors;
   a buffer layer made of $Al_aGa_bIn_{1-a-b}N$ (0≦a,b<1, a+b≦1) having a specific composition located on top of an upper side of said substrate;
   an n-type contact layer located on top of said buffer layer;
   an active layer made of InGaN located on top of a part of said n-type contact layer's upper surface;
   a negative electrode located on top of another part of said n-type contact layer's upper surface not covered by said active layer;
   a p-type cladding layer made of Mg-doped $Al_{1-c-d}Ga_cIn_dN$ (0≦c,d≦1, c+d≦1) having a specific composition located on top of said active layer;
   a p-type contact layer made of Mg-doped $Al_{1-e-1}Ga_eIn_fM$ (0≦e,f<1, e+f≦1) having a specific composition located on top of said p-type cladding layer; and
   a positive electrode located on top of a part of said p-type contact layer's upper surface,
   wherein said n-type contact layer has a superlattice structure formed by a first number of first base layers made of an n-type group III nitride, and a second number of second base layers made of another n-type group III nitride, alternately stacked on top of each other, said second base layers have wider band gaps than those of said first base layers, a bottommost base layer of said n-type contact layer is selected from the group consisting of said first base layer and said second base layer, and a topmost base layer is selected from the group consisting of said first base layer and said second base layer; and wherein each of said first base layers and said second base layers is made of In- and Si-codoped $Al_{1-k}Ga_kN$ (0<k<1) having specific composition and doping density independent of other base layers.

7. The GaN-based MQW LED structure as claimed in claim 6, wherein at least one of said first base layers and said second base layers has an In- and Si-codoping density greater than $1 \times 10^{19}$ cm$^{-3}$.

8. The GaN-based MQW LED structure as claimed in claim 6, wherein said n-type contact layer has a thickness between 2 μm and 5 μm.

9. The GaN-based MQW LED structure as claimed in claim 6, wherein a sum of said first number and said second number is between 50 and 500, and a difference between said first number and said second number is at most one.

10. The GaN-based MQW LED structure as claimed in claim 6, wherein each of said first base layers and said second base layers has a thickness between 20 Å and 200 Å, independent of other base layers.

* * * * *